United States Patent [19]

Hensel et al.

[11] Patent Number: 4,707,197
[45] Date of Patent: Nov. 17, 1987

[54] METHOD OF PRODUCING A SILICIDE/SI HETEROEPITAXIAL STRUCTURE, AND ARTICLES PRODUCED BY THE METHOD

[75] Inventors: John C. Hensel; Anthony F. J. Levi, both of Summit; Raymond T. Tung, New Providence, all of N.J.

[73] Assignee: American Telephone and Telegraph Company, AT&T Bell Laboratories, Murray Hill, N.J.

[21] Appl. No.: 820,581

[22] Filed: Jan. 17, 1986

Related U.S. Application Data

[63] Continuation-in-part of Ser. No. 637,060, Aug. 2, 1984, abandoned.

[51] Int. Cl.[4] .................................. H01L 21/203
[52] U.S. Cl. .................. 437/189; 148/DIG. 147; 148/DIG. 25; 148/DIG. 72; 156/612; 437/200; 437/248
[58] Field of Search ...... 148/175, 1.5, 187, DIG. 140, 148/DIG. 147, DIG. 25, DIG. 72; 29/576 E, 576 T; 156/612, 603; 357/16, 60; 427/86

[56] References Cited

U.S. PATENT DOCUMENTS

| | | | |
|---|---|---|---|
| 4,357,183 | 11/1982 | Fan et al. | 148/181 |
| 4,477,308 | 10/1984 | Gibson et al. | 156/603 |
| 4,492,971 | 1/1985 | Bean et al. | 357/15 |
| 4,529,455 | 7/1985 | Bean et al. | 148/175 |
| 4,544,418 | 10/1985 | Gibbons | 148/1.5 |
| 4,555,301 | 11/1985 | Gibson et al. | 156/617 R |
| 4,632,712 | 12/1986 | Fan et al. | 148/175 |

OTHER PUBLICATIONS

Saitoh et al, "Double Heteroepitaxy in the Si (III)/CoSi2/Si Structure" in *Appl. Phys. Lett.* 37(2), Jul. 15, 1980, pp. 203–205.
Ishiwara et al. "Epitaxial Growth of Elemental Semiconductor Films onto Silicide/Si and Fluoride/Si Structures" in *J. Vac. Sci. Technol.* B1(2), Apr.–Jun. 1983, pp. 266–271.
Ishiwara et al., "Epitaxial Growth of Fluoride Films on Silicon Substrates" in Mat. Res. Soc. Symp. Proc., vol. 25 (1984), Elsevier, pp. 393–403.
Bean et al., "Silicon/Metal Silicide Heterostructures Grown by MBE" in *Appl. Phys. Lett.* 37(7), Oct. 1, 1980, pp. 643–646.
Tung et al., "Epitaxial Silicides" in *Thin Solid Films*, 93 (1982), pp. 77–90.
Canali et al., "Solid Phase Epitaxial Growth of Si Through Pd2Si Layers" in *J. Appl. Phys.*, vol. 46, No. 7, Jul. 1975, pp. 2831–2836.
Campisi et al., "Heteroepitaxial Silicon Growth on Polycrystalline MoSi2" in J. Appl. Phys. 52(8), Aug. 1981, pp. 5043–5049.
*Journal Applied Physics* 55(10), May 15, 1984 "Epitaxial Growth of Si Films on CaF2/Si Structures with Thin Si Layers Predeposited at Room Temperature" by T. Asano et al., pp. 3566–3570.
*IEEE Transactions on Electron Devices*, vol. ED110, "Comparison of Hot Electron and Related Amplifiers" by John L. Moll, pp. 299–304 (1963).
*Solid State Electronics*, vol. 9, "Appraisal of Semiconductor-Metal-Semiconductor Transistor", by S. M. Sze et al., pp. 751–769 (1966).
IEEE *Technical Digest*, International Electron Device Meeting, "Fabrication and Microwave Performance of the Permeable Base Transistor", by C. O. Bozler et al, pp. 384–387 (1979).
*Electrons and Phonons*, The Theory of Transport Phenomena in Solids, by J. M. Ziman, Oxford University Press, p. 259, 1960.
*Physical Review Letters*, vol. 52, No. 6, "Schottky-Barrier Formation at Single-Crystal Metal Semiconductor Interfaces", by R. T. Tung, pp. 461–464, Feb. 6, 1984.
*Proceedings of the 2nd International Symposium on Molecular Beam Epitaxy*, "Low-Temperature Surface Cleaning of Silicon and Its Application to Silicon MBE", by A. Ishizaka et al., pp. 183–186, Tokyo, 1982.

Primary Examiner—Brian E. Hearn
Assistant Examiner—T. N. Quach
Attorney, Agent, or Firm—Eugen E. Pacher

[57] ABSTRACT

Described is a method for producing metal silicide/silicon heterostructures. The method comprises depositing a very thin Si "template" layer on a relatively cold (<200° C.) silicide substrate, raising the substrate temperature into the approximate range 500°–800° C. and maintaining it there while depositing further Si onto the template. The resulting Si layer can be of high crystalline perfection. The silicide advantageously is $CoSi_2$, $Co_xNi_{1-x}Si_2$, $CoSi_yGe_{2-y}$, or $NiSi_2$, with $0 < x < 1$, $1 < y < 2$.

8 Claims, 5 Drawing Figures

METHOD OF PRODUCING A SILICIDE/SI HETEROEPITAXIAL STRUCTURE, AND ARTICLES PRODUCED BY THE METHOD

This application is a continuation-in-part of application Ser. No. 637,060, filed Aug. 2, 1984, abandoned.

FIELD OF THE INVENTION

This invention pertains to the field of electronic devices comprising a single crystal semiconductor substrate with an epitaxial metal layer thereon, and to methods for producing such devices.

BACKGROUND OF THE INVENTION

Since the early days of semiconductor device development, researchers have proposed metal base transistors, i.e., electronic devices in which electrons are injected from a semiconductor emitter into a thin metal base layer. For at least one type of metal base transistor, it is required that a significant fraction of the injected electrons traverse the base layer without being scattered, and furthermore, penetrate a metal/semiconductor interface to enter into the semiconductor collector.

Early theoretical treatment of such structures suggested that practical metal base transistors of this type were achievable without the necessity for further significant advances in technology. For instance, in a paper by J. L. Moll (*IEEE Transactions on Electron Devices*, Vol. ED/10, pp. 299–304, (1963)) it was stated that gold appears to be the most favorable metal for the metal base, that a 200 Å thick gold film will transmit approximately 60 percent of the injected electrons, and that the quantum mechanical reflection at the base/collector interface is probably very small.

However, careful later work showed that, because of fundamental physical limitations, even the performance of proposed optimal metal base transistors would fall far short of previous expectations. For instance, the Si-/Au/Ge metal base transistor was found to have a maximum low frequency common base current gain in the neighborhood of 0.3. It was also stated that it is unlikely that a materials combination exists that is capable of yielding substantially higher current gain. (S. M. Sze et al, *Solid State Electronics*, Vol. 9, pp. 761–769, (1966), incorporated herein by reference.) The authors of that paper also concluded that the greatest unsolved technological problem in semiconductor/metal/semiconductor transistor technology is the deposition of device-quality semiconductor materials on thin metal films, since, as of the date of the paper, there had been no reports of epitaxial growth of semiconductor material on films of the metals with longest electron mean free paths, namely, gold and silver.

Possibly to avoid the above-referred to technological problems, transistor structures that avoided the necessity to grow device-quality semiconductor material atop a metal layer were proposed and built. For instance, C. O. Bozler et al (*IEEE Technical Digest*, International Electron Device Meeting, pp. 384–387, (1979)), disclosed a permeable-base transistor in which an extremely fine tungsten grating is embedded inside a single crystal of n-type gallium arsenide, with the grating providing means for controlling the current from the emitter to the collector.

A major step towards realization of practical ballistic electron devices was the discovery, by J. C. Bean et al, of a method for preparing metal silicide/silicon heterostructures that yield a device-quality metal layer, the silicide layer, atop a single crystal silicon substrate. Since the silicide layer could be grown to be epitaxial with the substrate, the silicide layer could form the substrate for growth thereon of an epitaxial semiconductor layer, making possible the growth of epitaxial heterostructures incorporating a metal layer. See U.S. patent application Ser. No. 156,649, filed June 5, 1980, now U.S. Pat. No. 4,492,971, and U.S. patent application Ser. No. 445,014, filed Nov. 29, 1982, now U.S. Pat. No. 4,554,045 both co-assigned with this and incorporated herein by reference. In the former application are disclosed also articles comprising a single crystal silicon substrate, a single crystal metal silicide layer overlying the silicon substrate, and a single crystal silicon layer overlying the metal silicide, with the thus formed composite structure having an essentially continuous single crystal lattice between the three layers. Cobalt silicide and nickel silicide are exemplary silicides disclosed in the above applications.

Further relevant disclosures were made by Gibson et al (U.S. patent application Ser. No. 429,291, now U.S. Pat. No. 4,477,308, co-assigned with this), and incorporated herein by reference, namely, a method for growing epitaxial silicide on silicon comprising deposition of a thin template layer. This approach permits, inter alia, control of the orientation of silicide grown on (111)-oriented silicon, where the epitaxial material can grow in one of two orientations (A or B), or as a mixture thereof. H. Ishiwara et al, *Materials Research Society Symposium Proceedings*, Vol. 25, pp. 393–403 (1984) disclose growth of Si on a $CaF_2$ substrate by pre-deposition of a thin Si layer at room temperature, followed by deposition thereon of a thick Si film at 800° C.

Although great strides have recently been made in the growth of epitaxial metal layers on semiconductors, we know of no practical ballistic electronic devices. Because of the great promise of such a device, especially its potential for very high frequency operation, such a device would be of considerable commercial interest. This application discloses such a device.

DEFINITIONS

"Electron mean free path" is used herein in its conventional sense, namely, the average distance an electron travels between collisions. See, for instance, J. M. Ziman, *Electrons and Phonons*, Oxford University Press (1960), page 259. The mean free path is understood herein to be the mean free path of electrons at or near the Fermi energy. The average distance between collisions for electrons at other energies, e.g., "hot" electrons, typically will differ from the mean free path.

The "composition" of the layers of multiconstituent materials referred to herein is the nominal average composition of the layer material. For instance, if the layer material is not homogenous, e.g., when a layer of Si is deposited onto a previously deposited layer of Co, the "composition" of the layer material is the same as if the same amounts of Co and Si had been co-deposited.

By "metal silicide" we mean herein binary materials such as $NiSi_2$ and $CoSi_2$, as well as ternary materials such as $Co_xNi_{1-x}Si_2$ and $CoSi_yGe_{2-y}$.

SUMMARY OF THE INVENTION

We have discovered that a silicon/metal silicide/silicon heterostructure can be used to construct ballistic metal base transistors and other ballistic electronic devices of a quality far better than was thought possible in the prior art. In preferred embodiments, the metal silicide is nickel silicide (NiSi$_2$), cobalt silicide (CoSi$_2$), Co$_x$Ni$_{1-x}$Si$_2$ (0<x<1, preferably 0.5<x), or CoSi$_y$Ge$_{2-y}$ (1<y<2, preferably 1.5<y) with the cobalt silicide and the ternary materials being more preferred. In preferred embodiments the crystal lattice of the single crystal silicide substrate is oriented to have a (111) lattice plane substantially parallel (typically within about 5 degrees, as is often the practice in MBE growth) to the silicon/silicide interface.

In general terms, the invention is an article comprising two bounding members (frequently referred to herein as "emitter" and "collector") and a single crystal metal silicide layer (often referred to herein as "base") therebetween. One of the bounding members is a single crystal silicon substrate onto which the silicide layers is deposited. The other bounding member is a silicon layer overlying the silicide layer. The silicide layer is epitaxial with the silicon substrate, and the silicon layer typically is epitaxial with the silicide layer; that is to say, the crystal lattice direction, normal to the interface, namely, the [111] direction, is essentially continuous across the substrate/silicide layer interface and preferably also across the silicide layer/silicon layer interface. Although the silicon layer preferably consists of B-type (or A-type) material only, for some applications the layer can consist of a mixture of A- and B-type material, or possibly even be polycrystalline. Heterostructures according to the invention are thermally stable, at least to the degree that it is possible to anneal a Si/silicide structure with a relatively thick (e.g., 5000 Å) Si layer thereon at about 800 degrees C. for about 30 minutes, sufficient to remove implantation damage in the Si layer.

The inventive article is adapted for injecting electrons from one of the bounding members, the emitter, into the metal silicide layer. This typically requires means for making electrical contact at least to the emitter and to the silicide layer (typically also to the collector). Injection requires application of voltages of the appropriate polarity, typically between the emitter and the silicide layer, and also between the silicide layer and collector.

In articles according to the invention, the electron mean free path (mfp) in the silicide layer at or below 25 degrees C. typically is longer than the thickness of the silicide layer, thereby making possible a high current transfer ratio between emitter and collector. Unless otherwise stated, values of all physical parameters herein are understood to be the values at 25 degrees C.

An electronic device having the above-specified property that the room temperature electron mean free path in the silicide layer exceeds the thickness of the silicide layer we call a ballistic electronic device. This is to be contrasted with conventional devices, e.g., bipolar transistors, in which essentially all electrons suffer a multiplicity of collisions during their transit of the base layer, executing a diffusive drift motion across the base. Such motion is relatively slow. On the other hand, the ballistic traversal of the silicide layer in the device according to the invention is extremely fast (of the order $10^{-14}$ seconds), since the electron velocity is of the order of the Fermi velocity in the silicide, a metal, and the silicide layer can be very thin, of the order of 100 Å, due to the high conductivity of the silicide. Devices according to the invention thus have the potential of operation at very high frequencies.

A novel method for producing a Si layer that is epitaxial with an underlying metal silicide layer comprises depositing a very thin layer (typically between about 10 Å and about 100 Å thick) onto the silicide layer substrate, with the substrate maintained at a relatively low temperature, typically below about 300 degrees C. Subsequently, the substrate temperature is raised, typically to the range 500–800 degrees C., maintained at the higher temperature for a time effective to result in ordering of the deposited Si, typically less than about 15 minutes, and further Si deposited. An optional brief intermediate temperature anneal may at times be advantageously used. With this deposition technique we have succeeded in growing Si layers that are epitaxial with the underlying metal silicide layer and have a $\chi_{min}$<10 percent.

DETAILED DESCRIPTION

In the broadest sense, the invention is an article comprising a multilayer composite structure, the structure comprising a single crystal silicon substrate, a single crystal metal silicide layer overlying the substrate, and a silicon layer overlying the silicide layer. Although the article may comprise further layers, including further metal silicide layers, the discussion herein will be generally in terms of a three-level structure only. This is for purposes of concreteness only and is not intended to imply that the invention is thus limited.

A central aspect of the invention is the requirement that (at 25 degrees C. or below) the electron mfp in the metal silicide layer be long, typically exceeding the silicide layer thickness. This implies use of a very thin silicide layer and/or use of highly perfect silicide material in which electrons can travel a considerable distance before being scattered.

We have found that a reasonable layer thickness is about 100 Å, with the useful range of thickness typically being from about 50 Å to about 200 Å, and have discovered a method that can reliably produce such thin layers of highly perfect epitaxial single crystal silicide. We have also discovered that metal silicides, in particular, cobalt silicide (CoSi$_2$) and nickel silicide (NiSi$_2$), can be prepared such as to have a surprisingly long electron mfp. Of these, CoSi$_2$ has a particularly long mfp, about 200 Å at room temperature, and is currently considered to be the most preferred silicide for devices according to the invention.

The finding that metal silicides can have such long mfp is surprising in view of contrary teachings in the prior art. For instance, the prior art teaches that Au and Ag have the longest mfp (about 220 Å and 350 Å, respectively), that other monovalent metals and transition metals are expected to have a mfp smaller than Au, and that, due to the presence of additional scattering mechanisms, all intermetallic components such as MoSi$_2$ have a still shorter mfp. (Sze et al, op. cit., page 755.)

At least some metal silicides e.g., (CoSi$_2$, Co$_x$Ni$_{1-x}$Si$_2$, CoSi$_y$Ge$_{2-y}$ and NiSi$_2$) not only have an unexpectedly long mfp, comparable to that of Au, but they can also be grown epitaxially on a Si substrate. Furthermore, Si can be grown epitaxially on these silicides, making possible growth of a multilayer structure in which the crystal lattice orientation is continuous throughout. Some techniques for such epitaxial growth were disclosed in previously referred to U.S. patent applications Ser. Nos. 156,649 and 445,014.

Figure 1:
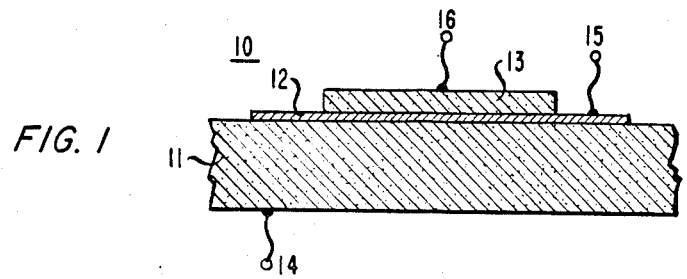
FIG. 1 is a schematic representation of an exemplary Si/silicide/Si structure according to the invention.

An exemplary three-terminal device 10 according to the invention is schematically depicted in FIG. 1. Single crystal silicide layer 12 is sandwiched between two Si bounding members, namely, substrate 11 and layer 13. Electrical contact can be made to substrate, silicide layer, and Si layer by means of terminals 14, 15, and 16, respectively.

Typically, both Si bounding members comprise doped material. For instance, at least the substrate material at the substrate/base interface (typically epitaxial Si), as well as the interface portion material of the Si layer, may be doped with a donor element (col. V), e.g., As. However, doping with an acceptor element (col. III) is also possible and is contemplated. Furthermore, the dopant may be distributed substantially uniformly in the relevant part of a bounding member, or a nonuniform doping profile may be used. For instance, it may be desirable to provide for a relatively lightly doped (e.g., about $10^{16} cm^{-3}$ dopant atoms) Si region at the interface with the silicide, and a relatively heavily doped (e.g., $10^{19} cm^{-3}$ dopant atoms) Si region bordering thereon. Such doping is discussed, for instance, in Sze et al. On the other hand, it may be desirable to heavily dope the Si at and near the interface with the silicide, resulting in a tunneling barrier between the silicide and the Si member. Another possibility is "spike" doping of the Si layer material, e.g., forming a very thin p-type layer in n-type material. Such a layer could, for instance, be formed by MBE at, or close to, the silicide/Si layer interface, to increase the Schottky barrier height.

Figure 2:
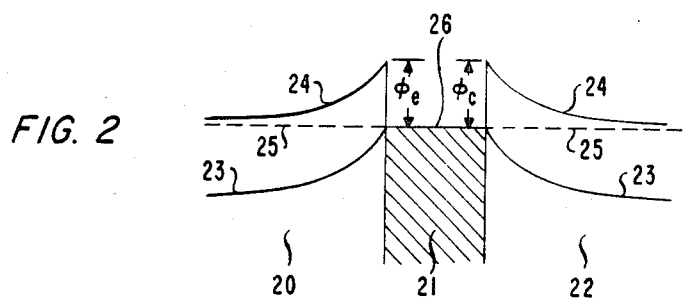
FIG. 2 is a band diagram for an exemplary heterostructure according to the invention.

FIG. 2 shows an exemplary equilibrium band diagram of a three-layer combination (Si/silicide/Si) according to the invention. Bounding members 20 and 22 are shown to be n-type material, having roughly equal moderate dopant concentration, since Fermi levels 25 are shown within the energy gap between valence bands 23 and close to conduction band edges 24. The energy bands of silicide layer 21 are filled to the Fermi level 26. As is well known, in equilibrium the potentials at a junction between dissimilar materials adjust such as to make the Fermi levels equal throughout the sample. This results in bending of the semiconductor band structure near the junctions, as shown in FIG. 2. The quantities $\phi_e$ and $\phi_c$ are the Schottky barrier heights between the silicide and the "emitter" bounding member, and between the silicide and the "collector" bounding member, respectively. In FIG. 2, $\phi_e$ is shown to be approximately equal to $\phi_c$. This is not necessarily the case, and it may actually be advantageous for $\phi_c$ to be less than $\phi_e$.

Figure 3:
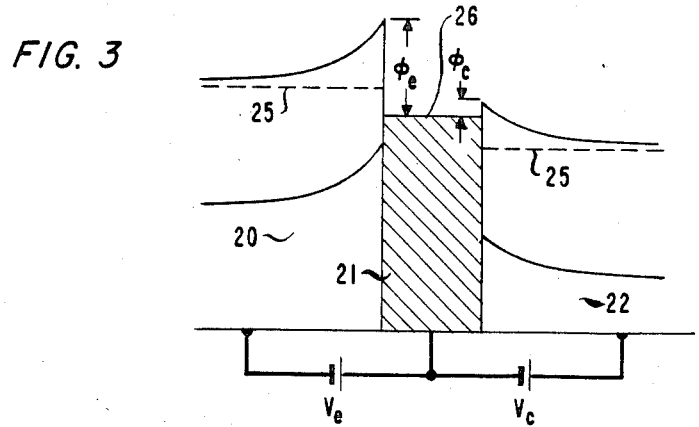
FIG. 3 is a further exemplary band diagram.

An exemplary band diagram of a heterostructure with $\phi_e > \phi_c$ is shown in FIG. 3. Applied potentials $V_e$ (<0) and $V_c$ (>0) forward bias the emitter base junction and reverse bias the base/collector junction, respectively, resulting in a net current from 20 to 22 by injecting electrons from 20 into the "base" 21, a fraction $\alpha$ of the injected electrons crossing over the base/collector barrier.

The probability that a carrier will be able to penetrate the collector from the base increases with increasing excess energy of the carrier over the collector barrier. For this reason, it is advantageous to choose a heterostructure such that $\phi_e > \phi_c$. The Si/silicide system offers a unique opportunity for achieving this, while at the same time maintaining the crystal lattice orientation continuous throughout the device, as will now be discussed.

As was disclosed before (U.S. patent application Ser. No. 429,291), at least some metal silicides, including $CoSi_2$ and $NiSi_2$, can grow on a (111)-oriented Si substrate epitaxially as either A-type material, B-type material, or as an A-B mixture. A-type material has an orientation identical in every way to that of the substrate. In particular, every crystal lattice direction [abc] is identical in the Si substrate material and A-type silicide overlying the substrate. On the other hand, in B-type material the lattice orientation is continuous across the Si/silicide interface (both substrate and silicide are of (111) orientation), but the overlying silicide lattice is rotated by 180 degrees with respect to the substrate lattice. This results in discontinuity of some crystal lattice directions across the interface. For instance, the [111] direction normal to the interface is continuous across the interface, whereas all [100] directions are discontinuous.

It has been found that A-type $NiSi_2$ on Si and B-type $NiSi_2$ on Si do not have identical Schottky barrier heights, but that the latter exceeds the former by about 0.14 eV. (R. T. Tung, *Physical Review Letters*, Vol. 52, page 461 (1984).) Since it is possible to selectively grow either A-type or B-type material, it is thus possible to manufacture devices comprising Si/silicide/Si heterostructures with non-symmetrical barrier heights. For instance, in an exemplary metal base transistor the (111)-oriented Si substrate is the collector, the base is A-type $NiSi_2$, and the Si emitter is B-type with respect to the base (and collector).

The major hurdle towards realization of a viable metal base transistor that was encountered by the prior art was the inability to grow device-grade semiconductor material atop the metal base. The Si/silicide system overcomes this problem. $NiSi_2$ and $CoSi_2$ have the same crystal structure as Si, and have lattice constants that are very close to that of Si (5.41 Å and 5.37 Å, respectively, vs. 5.43 Å). Ternary materials such as $Co_xNi_{1-x}Si_2$ ($0.5 < x < 1$) and $CoSi_yGe_{2-y}$ ($1.5 < y < 2$) can have better lattice match than $CoSi_2$ while retaining much of the high conductivity of $CoSi_2$, can be grown such as to form an essentially continuous layer of high quality epitaxial material, and are considered by us to be materials that may advantageously be used in electronic devices according to the invention, e.g., in a metal base transistor. In heterostructures according to this invention, the Si layer overlying the silicide layer typically has a Rutherford backscattering ratio $\chi_{min}$ less than about 10 percent, preferably less than about 6 percent. $\chi_{min}$ is the ratio of the backscattering yield in a channeling direction, e.g., [111], to the yield in a random direction, and is a well-known measure of crystal perfection.

Due, inter alia, to the long electron mfp in the silicide (as compared to the base layer thickness), the high crystalline perfection of the Si layer overlying the base, and the continuity of lattice orientation and minimal change of lattice constant throughout the inventive heterostructure, metal base transistors according to the invention can have current transfer ratios exceeding those previously thought possible. Such transistors typically will have DC common base current gain of at least 0.5 at 25 degrees C. or below, but preferably have a current gain greater than 0.8 or 0.9.

Figure 4:
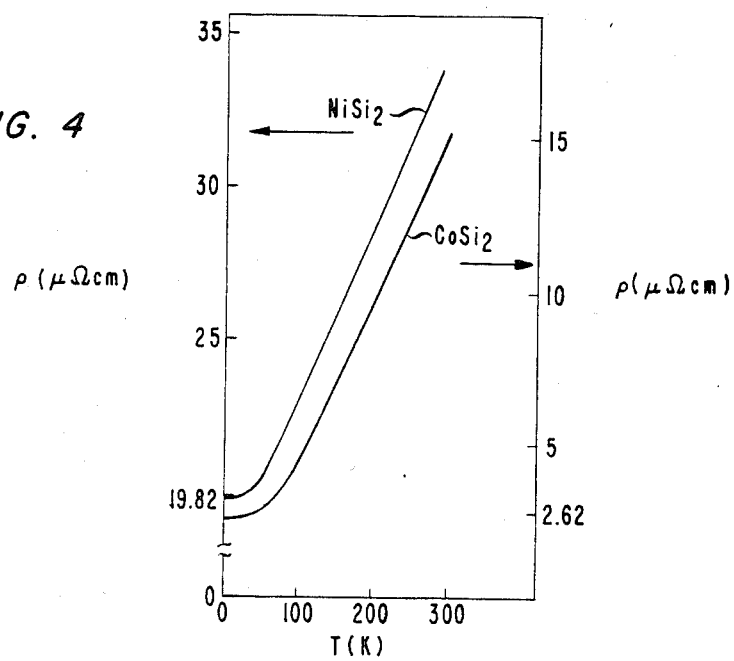
FIG. 4 shows the resistivities of NiSi$_2$ and CoSi$_2$ as a function of temperature.

As we have stated above, $CoSi_2$, when grown under appropriate conditions on Si, can have an unexpectedly long electron mfp. This manifests itself, inter alia, in an unexpectedly low value of the residual resistivity of such material, as is shown in FIG. 4, in which the resistivity of a thick ($>1000$ Å) $CoSi_2$ film is contrasted with that of a similar $NiSi_2$ film. As can be seen, the latter has a residual resistivity (at $T \sim 4.2$ degrees K.) almost eight times that of the former. On the other hand, the linear portions of the two resistivity curves are quite similar, implying similar electron-phonon coupling in the two materials.

Figure 5:
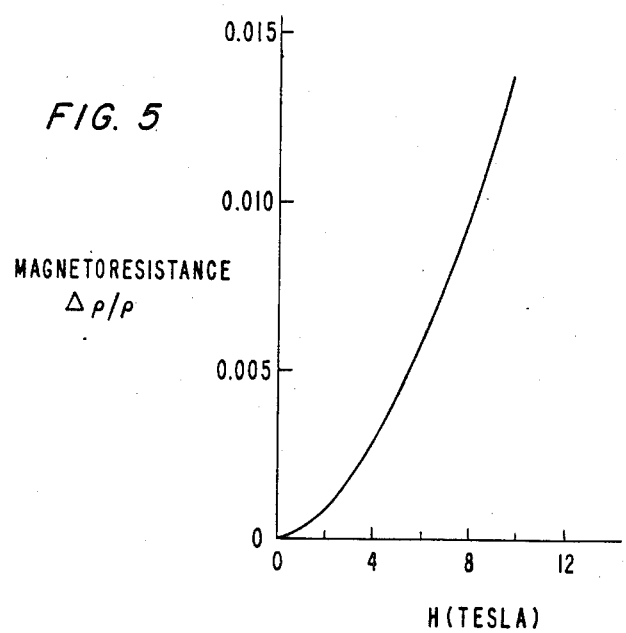
FIG. 5 shows the magnetoresistance of CoSi$_2$.

The electron mfp is most directly determined by means of magnetoresistance measurements, since:

$$\Lambda_e = [k_F hc/2\pi eH]\omega_c \tau, \quad (1)$$

and $$\Delta\rho/\rho = A(\omega_c \tau)^2, \quad (2)$$

where:
$\Lambda_e$ is the electron mfp,
$k_F$ is the Fermi wavevector,
h is Planck's constant,
c is the velocity of light,
e is the electron charge,
H is the value of the magnetic field,
$\omega_c$ is the cyclotron frequency,
$\tau$ is the electron mean free time,
$\rho$ is the resistivity at zero magnetic field,
$\Delta\rho$ is the change in resistivity with magnetic field, and
A is a known factor of order unity. In $CoSi_2$, for instance, A is about 0.5. A curve of magnetoresistance of $CoSi_2$ at 4.2 degrees K. as a function of magnetic field is shown in FIG. 5.

Evaluating Equation 1 for $CoSi_2$ at 4.2 degrees K. yields an electronic mfp of about 1000 Å, and a mfp of about 200 Å in $CoSi_2$ at room temperature.

Detailed analysis of the magnetoresistance of $CoSi_2$ indicates that both electrons and holes participate in charge transport in $CoSi_2$, and tentative results suggest that the carrier density ratio $n_e/n_h \sim 5$ percent, with $n_h \sim 2 \cdot 10^{22} cm^{-3}$.

Although the determination of the mfp is relatively straightforward when the material is in the form of a thin layer (since the usual transport properties, including magnetoresistance, can then easily be measured), it is more complicated in a device of the type relevant herein. As is known to those skilled in the art, such determination requires typically measurement of the current gain, and correction for the barrier reflection and excess (hot electron) scattering.

Although other growth techniques, e.g., the method disclosed in U.S. Pat. No. 4,492,971 can produce metal silicide layers of acceptable quality, we have discovered a novel growth technique that can produce very thin, single crystal, silicide layers of very high crystalline quality and good thermal stability. This technique is currently preferred by us for growing devices according to the invention.

The novel techniques comprises deposition of metal and silicon onto a relatively cold silicon substrate. The substrate, which is cleaned and otherwise prepared by methods well known in the art (see, for instance, U.S. patent application Ser. No. 156,649; also, A. Ishizaka et al, *Proceedings of the 2nd International Symposium on Molecular Beam Epitaxy*, page 183, Tokyo, 1982), is maintained at a relatively low temperature, typically below about 200 degrees C., preferably at or near room temperature, while deposition takes place. The procedure (as well as all other material deposition procedures referred to herein) is advantageously carried out in UHV (e.g., about $10^{-9}$ Torr), and deposition can be by any appropriate method, such as molecular beam or other vapor deposition method, by co-deposition, or by sequential deposition. The fluxes are advantageously adjusted such that the deposit is metal-rich. For instance, we found that a 1:1 Co/Si deposit can yield high quality $CoSi_2$, and we believe that a deposit of average composition $MSi_x$, $0 \leq x \leq 2.6$, preferably $0.5 < x < 1.5$, can result in metal silicide $MSi_2$ of good quality.

After deposition of the appropriate quantity of metal and Si, the substrate temperature is typically raised to an intermediate temperature above about 300 degrees C., typically in the range 300–500 degrees C., for a few minutes, typically less than about 30 minutes, and then is further raised to a final temperature, typically in the range 500–700 degrees C., and maintained at the final temperature for a few minutes, typically also less than about 30 minutes. In a typical processing sequence, we have deposited about 35 Å of Co, followed by deposition of about 63 Å of Si, onto a [111]-oriented Si substrate at room temperature. The rate of deposition typically was about 0.5 Å/sec for Co, and about 1 Å/sec for Si. However, we believe that the deposition rates are not critical process parameters.

Following deposition, the substrates typically are heated to about 400 degrees C. and maintained at that temperature for about 5–10 minutes. Following this intermediate temperature step, the substrates typically are maintained at about 600 degrees C. for about 15 minutes. With this technique, we have routinely produced single crystal $CoSi_2$ (and $NiSi_2$) having $\chi\chi_{min}$ of about 4 percent. Layers produced by this technique were as thin as 50 Å, and we know of no reason why even thinner layers of device quality could not be formed. We believe that metal silicides of similar quality could also be formed by pulsed laser melting and liquid phase epitaxial regrowth. See U.S. patent application Ser. No. 506,069, filed June 20, 1983, now U.S. Pat. No. 4,555,301 co-assigned with this. Some variations on the above described method for forming an epitaxial metal silicide layer on a Si substrate are also possible. For instance, we have found that deposition onto a "cold" Si substrate (i.e., $<200°$ C.) of a thin layer of metal (e.g., Co, Ni, or $Co_xNi_{1-x}$, with $0<x<1$, preferably $0.5<x<1$), or of a thin layer of the metal followed by a thin layer of Si, or Si and Ge, with subsequent heating (typically for a time $<30$ minutes, e.g., $<5$ minutes) to a temperature in the range 450° C.–650° C. K, can result in formation of epitaxial metal silicide of high crystalline perfection. Co-deposition of metal and silicon, or Si and Ge, onto a "cold" substrate, followed by ordering at the higher temperature (for a time $<30$ minutes, typically $<5$ minutes), is also possible, and is currently preferred by us for forming a thin layer of epitaxial $Co_xNi_{1-x}Si_2$, or $CoSi_yGe_{2-y}$.

We have also discovered a novel technique for growing an epitaxial Si layer on a silicide substrate, typically, the metal silicide layer of a heterostructure according to the invention. The novel technique can solve a problem associated with prior art techniques, namely, the instability of the silicide (e.g., NiSi$_2$), which tends to diffuse to the surface of the Si layer formed on the silicide. The technique comprises depositing, at a relatively low substrate temperature (typically less than about 300 degrees C., preferably less than 200 degrees C.), a very thin layer of Si onto the substrate. Typically, the layer is between about 10 and 100 Å thick, preferably less than 50 Å. For instance, in some embodiments we have advantageously used layers about 20 Å thick. The deposition rate is not critical; we have used rates between about 0.5 Å/sec and about 3 Å/sec. After raising the substrate temperature to a temperature between about 500 degrees C. and about 800 degrees C., preferably between about 500 degrees C. and about 700 degrees C., and maintaining it at that temperature for typically less than about 15 minutes, preferably about 5 minutes or less, further Si is deposited until the desired thickness of Si is reached. The deposition rate is not critical; we have used rates between about 3 Å/sec and about 10 Å/sec. In general, raising the temperature of the substrate to a temperature above 400° C. transforms the thin layer of Si (the template layer) into epitaxial crystalline material.

By way of example, we have deposited a 20 Å layer of Si onto an approximately 100 Å thick layer of [111]-oriented CoSi$_2$, the substrate being at about 80 degrees C., then raised the substrate temperature to about 700 degrees C. After 2 minutes at that temperature, we deposited about 0.5 μm of Si onto the previously deposited Si, while maintaining the substrate temperature substantially constant. The Si was deposited from an evaporation source at a rate of about 5 Å/sec.

Some variations on the above described method for forming an epitaxial Si layer on a metal silicide substrate are also possible. For instance, we have found that deposition of the thin Si template layer onto a "cold" (<200° C.) NiSi$_2$ layer, followed by a brief (typically <5 minutes) pause, e.g., for measurement purposes, at an intermediate temperature (450°–500° C.), which in turn was followed by vapor deposition of the remainder of the Si at a higher substrate temperature (500°–600° C.), resulted in formation of an epitaxial layer of Si of excellent crystal quality, without significant out-diffusion of metal from the nickel silicide layer. Similar intermediate temperature pauses, or even more complicated time/temperature programs, may be possible in general in the formation of Si/silicide/Si heteroepitaxial structures.

The same processes can, of course, be adapted to the deposition of doped Si, for instance, the co-evaporation of dopant and Si. Silicon layers formed by the above processes can also be doped by ion implantation, followed by an anneal. These and other doping techniques are known to those skilled in the art and require no elaboration. Furthermore, it will be appreciated by those skilled in the art that the methods disclosed herein can be used to fabricate metal/semiconductor superlattices, i.e., heterostructures comprising a plurality (two or more) of silicide layers separated by semiconductor layers. Devices comprising metal/semiconductor superlattices can be expected to have novel electrical and/or optical properties not attainable with conventional semiconductor superlattices, and are contemplated by us. For instance, such devices may comprise strained layer superlattices in which at least the layers of one type (e.g., the silicide layer) are so thin (e.g., <100 Å) that their lattice constant is essentially equal to that of their substrate and overlayer.

EXAMPLE I

A [111]-oriented wafer of n-type silicon (resistivity about 0.2 Ω cm) was cleaned and otherwise prepared substantially as described in A. Ishizaka et al, op. cit. On this wafer was grown an about 184 Å thick layer of CoSi$_2$. With the substrate being at room temperature, we deposited a 51 Å thick layer of Co, followed by deposition of a 65 Å thick layer of Si. The temperature was raised to about 400 degrees C., the wafer maintained at that temperature for about 10 minutes, then the temperature was raised to about 600 degrees C. and the wafer maintained at that temperature for about 15 minutes. After cooling of the wafer to about 80 degrees C., and without breaking of the vacuum, we deposited a 20 Å thick layer of Si onto the CoSi$_2$ layer. After raising the temperature of the wafer to about 700 degrees C. and maintaining it at that temperature for about 2 minutes, we deposited about 0.5 μm of Si onto the previously deposited Si layer. Into the thus formed Si layer we implanted P ions (155 KeV) such as to obtain n-type material ($3.10^{15}$cm$^{-3}$) at the Si/CoSi$_2$ interface. The near-surface region of the Si layer was heavily implanted with P, such that a layer of degenerate silicon was formed. The composite structure was annealed at 800 degrees C. for about 30 minutes in vacuum to remove implantation damage. Collector contacts were formed by depositing Sb onto the back surface of the wafer, and laser melting and recrystallizing appropriately located Sb-covered surface regions. This resulted in formation of degenerate contact regions.

We formed mesa structures on the top surface of the wafer by standard lithography and plasma etching techniques. The mesas were basically circular, for provision for contacting the base with the Si substrate and the CoSi thereon (collector and base, respectively) having about 300 μm diameters, and the top Si layer (emitter) a diameter of about 200 μm. Electrical measurements were made on the mesa-type transistors by a conventional method. For instance, we measured a transistor in a common base configuration. We obtained a family of curves representing the collector I/V characteristics, with each curve representing a different emitter injection current, the base/collector junction being reverse biased. The collector current was found to be substantially independent of collector voltage for a collector voltage between about 1 and 3 volts. The measurements indicate that two back-to-back Schottky barriers were formed. The measurements also indicate that the DC common base current gain of the structure is greater than 0.5.

EXAMPLE II

A Si(111) substrate was prepared substantially as in Example I, followed by deposition thereon, by e-gun evaporation (at about 1 Å/sec), of about 18 Å of Ni, with the substrate at room temperature. Raising the substrate temperature to about 500° C. and maintaining it at that temperature for about 1 minute resulted in formation of a 65 Å thick layer of NiSi$_2$(111) of type A orientation. After lowering of the substrate temperature to room temperature, a 20 Å thick layer of Si was deposited (at 1 Å/sec) by e-gun evaporation, and the temperature raised, with a 1 minute pause at about 450° C. to obtain a LEED pattern. Subsequently the substrate temperature was raised to about 540° C. and 2000 Å of Si deposited at a rate of 2 Å/sec, followed by cooling of the sample to room temperature. All of the processing subsequent to formation of the oxide layer on the Si substrate was carried out in UHV, with the pressure always $<5.10^{-8}$ Pa. The thus produced Si layer on NiSi$_2$ had $\chi_{min} \sim 3\%$, with the interface being smooth and impurity free.

EXAMPLE III

A Si/Co$_x$Ni$_{1-x}$Si$_2$/Si heteroepitaxial structure is formed by a method substantially as described in Example II, except as noted below. A 90 Å thick layer of Co$_{0.75}$Ni$_{0.25}$Si$_2$ is formed by co-deposition (at 1 Å/sec) from separate e-gun evaporators, of Ni, Co, and Si. The fluxes are adjusted to result in a substantially stoichiometric deposit. After completion of deposition, the substrate temperature is raised to 600° C. for 1 minute. The layer of Si atop the silicide layer is grown as described in Example II, except that, after room temperature deposition of 30 Å of Si, the temperature is raised to 560° C. and 3000 Å of Si are deposited. The thus formed Si layer has $\chi_{min} < 5\%$, with the interface being smooth and impurity free.

EXAMPLE IV

A Si/CoSi$_2$/Si heteroepitaxial structure was formed by a method substantially as described in Example II, except as noted below. A 30 Å thick layer of Co was deposited onto a Si(111) substrate at room temperature, the temperature raised to 550° C. for about 3 minutes, resulting in formation of a 110 Å thick layer of CoSi$_2$. 30 Å of Si were deposited (at 1 Å/sec) at room temperature onto the CoSi$_2$ layer, the temperature raised to 600° C. for about 1 minute, followed by deposition of 1500 Å of Si, at a rate of 2 Å/sec, at about 640° C. The resulting Si layer had $\chi_{min} \sim 4\%$, with the interface being smooth and impurity free.

EXAMPLE V

A Si/CoSi$_y$Ge$_{2-y}$/Si heteroepitaxial structure is formed by a method substantially as described in Example III, except that the 90 Å thick layer of CoSi$_{1.8}$Ge$_{0.2}$ is formed by co-deposition (1 Å/sec), from separate e-gun evaporators, of Co, Si, and Ge.

What is claimed is:

1. Method of forming a metal silicide/silicon heterostructure comprising a layer of silicon grown on a single crystal metal silicide substrate, the Si layer having a thickness t, the method comprising:
    (a) depositing a first layer of silicon onto the silicide substrate, the first layer thickness $t_1$ being less than t, the substrate being at a template deposition temperature below about 300° C.;
    (b) raising the temperature of the substrate with the first layer of silicon thereon to a bulk deposition temperature between about 500 degrees C. and about 800 degrees C.; and
    (c) depositing silicon onto the first silicon layer, the substrate being maintained substantially at the
    bulk deposition temperature, the amount of silicon deposited being the amount required to result in a Si layer of thickness t.

2. Method of claim 1, wherein the metal silicide is selected from the group consisting of CoSi$_2$, Co$_x$Ni$_{1-x}$Si$_2$, with $0<x<1$, CoSi$_y$Ge$_{2-y}$, with $1<y<2$, and NiSi$_2$, the template deposition temperature is less than about 200 degrees C., and the bulk deposition temperature is between about 500 degrees C. and about 700 degrees C.

3. Method of claim 1, wherein $t_1 < 100$ Å.

4. Method of claim 3, wherein the metal silicide is selected from the group consisting of CoSi$_2$, NiSi$_2$, Co$_x$Ni$_{1-x}$Si$_2$, $x \geq 0.5$, and CoSi$_y$Ge$_{2-y}$, $y \geq 1.5$.

5. Method of claim 1, wherein step (b) comprises maintaining the substrate at an intermediate temperature between the template deposition temperature and the bulk deposition temperature.

6. Method of claim 1, wherein the metal silicide/silicon heterostructure is at least part of an electronic device.

7. Method of claim 1, wherein the metal silicide/silicon heterostructure is at least part of a composite heteroepitaxial structure of alternating layers of silicon and metal silicide.

8. Method of claim 7, wherein the composite heteroepitaxial structure is at least part of an electronic device or of an optical device.

* * * * *

UNITED STATES PATENT AND TRADEMARK OFFICE
CERTIFICATE OF CORRECTION

PATENT NO. : 4,707,197

DATED : November 17, 1987

INVENTOR(S) : Raymond T. Tung

It is certified that error appears in the above-identified patent and that said Letters Patent is hereby corrected as shown below:

Column 1 at [75] change "John C. Hensel; Anthony F. J. Levi, both of Summit; Raymond T. Tung, New Providence, all of N.J." to --Raymond T. Tung, New Providence, N.J.--.

Signed and Sealed this

Twelfth Day of February, 1991

*Attest:*

HARRY F. MANBECK, JR.

*Attesting Officer*  Commissioner of Patents and Trademarks